(12) United States Patent  (10) Patent No.: US 8,450,149 B2
Bayan et al.  (45) Date of Patent: May 28, 2013

(54) STACKED LEADFRAME IMPLEMENTATION FOR DC/DC CONVERTOR POWER MODULE INCORPORATING A STACKED CONTROLLER AND STACKED LEADFRAME CONSTRUCTION METHODOLOGY

(75) Inventors: Jaime A. Bayan, San Francisco, CA (US); James D. Broiles, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/301,699

(22) Filed: Nov. 21, 2011

(65) Prior Publication Data

US 2012/0119343 A1 May 17, 2012

Related U.S. Application Data

(63) Continuation-in-part of application No. 13/170,017, filed on Jun. 27, 2011, and a continuation-in-part of application No. 12/581,065, filed on Oct. 16, 2009, now Pat. No. 8,222,716.

(51) Int. Cl.
*H01L 21/00* (2006.01)

(52) U.S. Cl.
USPC ............ 438/108; 257/676; 438/112; 438/107

(58) Field of Classification Search
USPC .................. 257/676; 438/112, 107
See application file for complete search history.

(56) References Cited

U.S. PATENT DOCUMENTS

| 3,915,729 | A | 10/1975 | Eustice |
| 5,926,695 | A | 7/1999 | Chu et al. |
| 5,994,768 | A | 11/1999 | Fogelson |
| 6,061,251 | A | 5/2000 | Hutchinson et al. |
| 6,064,115 | A | 5/2000 | Moscicki |
| 6,066,515 | A | 5/2000 | Schoenfeld et al. |
| 6,072,228 | A | 6/2000 | Hinkle et al. |
| 6,215,176 | B1 | 4/2001 | Huang et al. |
| 6,372,579 | B1 | 4/2002 | Tung |
| 6,448,107 | B1 | 9/2002 | Hong et al. |
| 6,483,180 | B1 | 11/2002 | Bayan et al. |
| 6,603,197 | B1 | 8/2003 | Yoshida et al. |
| 7,842,541 | B1 | 11/2010 | Rusli et al. |
| 8,026,589 | B1 | 9/2011 | Kim et al. |
| 2002/0024857 | A1 | 2/2002 | Stave |
| 2005/0260795 | A1 | 11/2005 | Park et al. |
| 2007/0001274 | A1 | 1/2007 | Henkle et al. |
| 2007/0181990 | A1 | 8/2007 | Huang et al. |
| 2011/0089546 | A1 | 4/2011 | Bayan |
| 2011/0140249 | A1 | 6/2011 | Lee et al. |

FOREIGN PATENT DOCUMENTS

JP  06-177315  6/1994

OTHER PUBLICATIONS

Search Report dated Feb. 28, 2011 from International Application No. PCT/US2010/045802.
Written Opinion dated Feb. 28, 2011 from International Application No. PCT/US2010/045802.

(Continued)

*Primary Examiner* — Julio J Maldonado
*Assistant Examiner* — Robert Bachner
(74) *Attorney, Agent, or Firm* — Eugene C. Conser; Wade J. Brady, III; Frederick J. Telecky, Jr.

(57) ABSTRACT

Methods and systems are described for enabling the efficient fabrication of small form factor power converter packages and other devices using stacked leadframes.

11 Claims, 10 Drawing Sheets

OTHER PUBLICATIONS

Search Report dated Feb. 28, 2011 from International Application No. PCT/US2010/045803.
Written Opinion dated Feb. 28, 2011 from International Application No. PCT/US2010/045803.
Office Action dated Oct. 12, 2011 from U.S. Appl. No. 12/581,065.
Vishay Siliconix; "Integrated DrMOS Power Stage" www.vishay.com; Document No. 64981, S10-2488-Rev. E; Nov. 1, 2010; 15 pages.
U.S. Appl. No. 13/170,017, filed Nov. 21, 2011.

STACKED LEADFRAME IMPLEMENTATION FOR DC/DC CONVERTOR POWER MODULE INCORPORATING A STACKED CONTROLLER AND STACKED LEADFRAME CONSTRUCTION METHODOLOGY

CROSS-REFERENCE TO RELATED APPLICATIONS

This application is a continuation in part of, and claims priority to, co-pending U.S. patent application Ser. No. 13/170,017, filed on Jun. 27, 2011 and entitled "DC/DC Convertor Power Module Package Incorporating a Stacked Controller and Construction Methodology." This application is also a continuation in part of, and claims priority to, co-pending U.S. patent application Ser. No. 12/581,065, filed on Oct. 16, 2009 and entitled "Multiple Leadframe Package." All of the foregoing are hereby incorporated by reference in their entirety for all purposes.

TECHNICAL FIELD

The present invention relates generally to power converter devices used in association with semiconductor systems. In particular, the invention refers to the construction of compact, small footprint power converters used in DC-DC power converters using stacked leadframes. Also, the invention relates to methods of construction and packaging of these reduced size converter packages.

BACKGROUND OF THE INVENTION

In the field of electronic and computer devices, there is a need for converting one power level to another power level to enable the operation of various systems. The power level required for the various electronic systems is quite commonly different from a power level provided to the electronic device. Also, several different power levels may be required to power the various systems of an electronic device.

Also, the same electronic device typically includes systems requiring several different power levels. Thus, in many electronic devices, there is a need for one or more power level shifters.

Power level shifters generally include a power module (also referred to herein as a power converter) and several associated systems (inductor's, capacitors, and the like). Power level shifters can consist of Field Effect Transistors (FET's) and controller ICs. One such arrangement is shown in FIG. 1.

In the depicted prior art convertor 10 a low side field effect transistor (LS FET) 11 is arranged on a leadframe 12. Also, a high side field effect transistor (HS FET) 13 and an associated controller 14 arranged on the leadframe 12. A pair of conductive clips (C1, C2) conductively interconnect the HS FET with the LS FET to form a switching connection. A problem with this arrangement is that the pair of clips are required to appropriately connect the LS FET 11, the HS FET 13, and the controller 14. The clips must be individually cut, positioned, aligned, and attached to connect the clips (C1, C2) with the FET's of the package 10. Thus, the number of components and the alignment difficulties associated with them results in long process and assembly times and results in increased fabrication costs and higher failure rates in the packages produced. Additionally, the layout of FIG. 1 presents a relatively large surface area due its planar die arrangement. The increased prevalence of small form factor devices such as cellular telephone, tablet computers, music players, e-readers, and so on put an increased premium on smaller components. Accordingly, the previously described large area power converter is becoming increasingly problematic when faced with the decreasing size of consumer electronic devices. Accordingly, a need for devices (including power convertors) having a smaller "footprint" is desirable. The depicted prior art converter package 10 has a very large surface area. This takes up valuable real estate on various electronic substrates. So both the large footprint of prior art device and the need for two clips are disadvantages of the prior art.

Accordingly, as explained in this patent, a power converter package having a more compact structure with a reduced foot print, a simplified manufacturing structure, and improved fabrication processes is desirable. It is one of the objects of this patent to provide such a package and modes for its manufacture.

SUMMARY OF THE INVENTION

In a first aspect, an embodiment of the invention describes power converter package having a low side field effect transistor (LS FET) mounted on a first leadframe and a high side field effect transistor (HS FET) mounted on a second leadframe. The second leadframe arranged so that it defines a plane arranged above a plane defined by the first leadframe such that the HS FET can be arranged above the LS FET. In another embodiment, the HS FET and the LS FET are electrically connected through the second leadframe.

In one particular embodiment, a power converter comprises a first leadframe and second leadframe associated with first and second leadframes and an associated controller. The first leadframe comprises a die attach site with source and gate pads and a leads. The LS FET is arranged on the die attach site such that its source and gates are connected with the associated source and gate pads of the first leadframe. The second leadframe includes a drain attachment site on one side and source and gate attachment sites on another side and configured such that the HS FET is arranged such that its source and gates are connected with the associated source and gate pads of the second leadframe. The second leadframe is arranged so that electrical contact between the LS FET drain and the HS FET source is made through a portion of the second leadframe. A third leadframe can also be arranged above the HS FET and the LS FET and be electrically coupled with the HS FET drain contact.

In another aspect, the invention comprises a method of forming a power converter package. In one embodiment, such a method can comprise arranging the LS FET on the first leadframe and electrically connecting the LS FET gate and source with associated gate and source pads of the first leadframe to form a first arrangement. Further arranging a HS FET on a second leadframe and electrically connecting the HS FET gate and source with associated gate and source pads of the second leadframe to form a first arrangement. Mounting the second assembly with the first assembly in a manner that facilitates electrical connection between the HS FET source and the LS FET drain. A third leadframe is then attached to enable voltage to be supplied to the drain of the HS FET. One or more reflow operations can be performed to join the leadframes and FET's. The controller is mounted with the package and appropriate ware bonds are formed. The wire bonded package is encapsulated. In the case of an encapsulated array of convertor packages, the packages can then be singulated to form individual power convertors.

In another aspect, the invention comprises a method of forming a multiple stacked leadframe IC package comprising, mounting a first IC die on a first leadframe, mounting a second IC die on a second leadframe, mounting the first and second leadframes one over another to a stacked leadframe configuration, and encapsulating them to form the IC package. The invention also encompasses a mounting tool that includes mounting members suitable for aligning leadframes of a stack and apertures suitably positioned such that a punch tool can be used to remove leadframe tie bars as needed.

General aspects of the invention include, but are not limited to methods, systems, apparatus, and related products for enabling the fabrication of reduced form factor power stacked leadframe power converter packages and the inventive power converter packages themselves.

BRIEF DESCRIPTION OF THE DRAWINGS

The invention and the advantages thereof may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF PREFERRED EMBODIMENTS

Figure 1A:
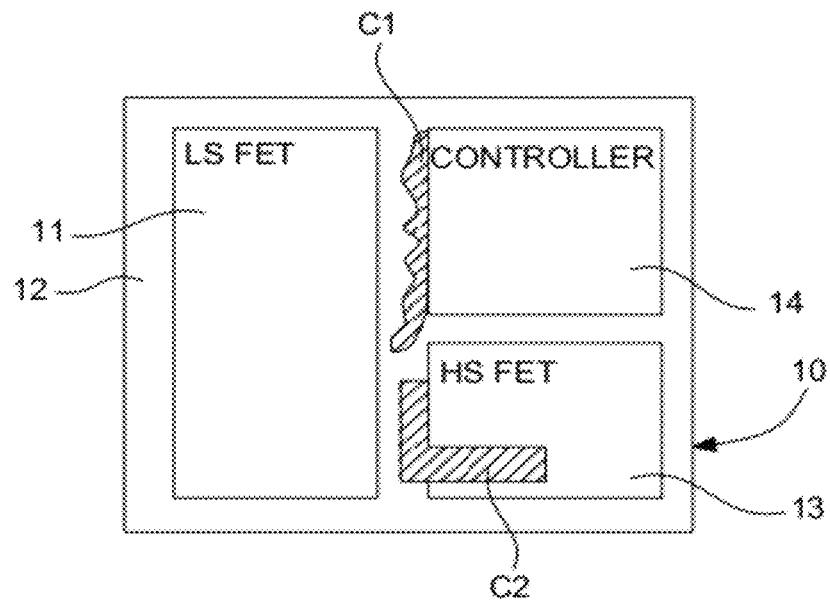
FIG. 1 is a plan view of a state of the art power converter device used level shifters

Reference is made to particular embodiments of the invention. Examples of which are illustrated in the accompanying drawings. While the invention will be described in conjunction with particular embodiments, it will be understood that it is not intended to limit the invention to the described embodiments. To contrary, the disclosure is intended to extend to cover alternatives, modifications, and equivalents as may be included within the spirit and scope of the invention as defined by the appended claims.

Aspects of the invention pertain to novel power converter modules or devices used in power level shifting applications and the methods of fabricating and packaging such devices. Such power converters are used in DC-DC voltage level shifting devices. For example in DC-DC step down level shifters and the like. In one example, a synchronous buck topology can be used in power converter modules used, for example, in a DC-DC power level shifter. Aims of the inventive technologies are to reduce power converter module footprint (surface area), increase power density (current per unit area), and simplify manufacturing by replacing prior art clips and introducing novel leadframe constructions. These leadframe implementations provide more flexibility and better alignment accuracy at less cost.

In another aspect, in one implementation, the controller rests on a first leadframe die attach pad (DAP). This orientation in grounds the controller thereby substantially immunizing it from noise generated by the operation of the FET's. Additionally, this arrangement facilitates the possibility of having vias in a multi layer PCB for improved heat dissipation. Accordingly, this implementation has certain advantages when applied to PCB layouts.

In the diagrammatic illustration of FIG. 2, an embodiment of an inventive power converter module is shown and shall now be described. The power converter device 100 includes a first substrate 103 upon which some of the power converter module systems and devices are arranged. A second substrate 113 upon which other components are attached. The first and second substrates preferably comprise first and second leadframes 103, 113 having die attach pads and a plurality of conductive leads as well as other connectors. During manufacture, the leadframes 103, 113 can comprise one leadframe of many such leadframes comprising a leadframe array. Of course, beyond leadframes, other suitable substrates may also be used. In general, aspects of the invention comprise arranging a set of components on the first leadframe 103 and arranging another set of components on the second leadframe 113 and then stacking the leadframes for further assembly. The invention further contemplates the stacking of additional leadframes onto the first and second leadframes.

To continue, rather than arranging all of the systems (11, 13, 14 as shown in FIG. 1) on a common level as in the prior art, the inventors employ propose a multi-level structure to form a more compact package. The following Figures and disclosure address this issue.

Figure 2:
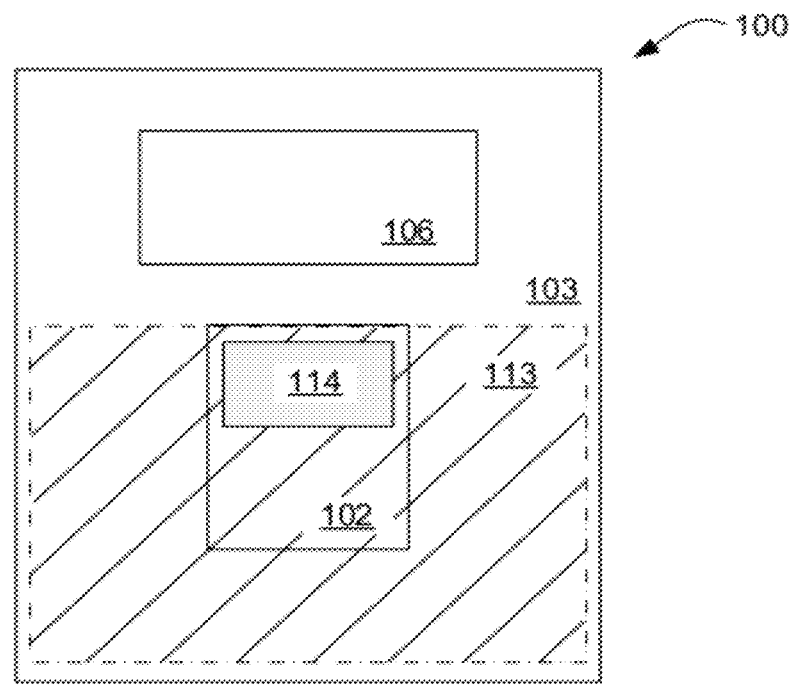
FIG. 2 is a simplified diagrammatic view showing a number of systems of an embodiment of power converter device in accordance with the principles of the present invention.

In the simplified diagrammatic illustration of FIG. 2, one embodiment of a stacked FET design is shown. In this implementation, a pair of leadframes 103, 113 are stacked one over the other to form a more compact power convertor. In one implementation a first die (here, for example, a LS FET 102) can be assembled with a first leadframe 103 and controller circuitry 114 and a second die (here, for example, a HS FET 101) is formed on the second leadframe 113. The pair of leadframes 103, 113 are then arranged in position one over the other and then affixed in place. Commonly, a reflow process can be used to secure the two leadframes (103, 113). It is pointed out that this mode of assembly is but one example with others being contemplated by this patent. For example, both dice (HS and LS FET's) 101, 102 can be mounted with the second leadframe 113 which can then be mounted with the first leadframe 103. Other permutations are also made apparent by the teachings of this patent. It is also pointed out that a third leadframe (not shown in this view) can be formed atop the first and second die 101, 102. In one implementation, the third leadframe can be used to, for example, supply power to the HS FET 101. Additionally, it is pointed out that other orders of arrangement are possible in accordance with the principles of the present invention. For example, the HS FET can be mounted on the first leadframe and arranged below the LS FET. Also, the controller can, in some embodiments, be arranged above both of the HS FET and the LS FET. Other configurations are possible.

The simplified illustrations of FIGS. 3(*a*) & 3(*b*) show a pair of side section views of portions of the multi-level converter package 100 embodiment. The cross sections are taken at two different locations to show how the leadframes (103, 113) are attached (e.g., FIG. 3(*a*)) and how the HS FET 101 and the LS FET 102 gates are coupled with the leadframes (e.g., FIG. 3(*b*)). To create a smaller footprint, this embodiment stacks the HS FET 101 over the LS FET 102, generally one over the other, and employs an offset controller 106 mounted with the first leadframe 103 (the controller 106 not shown in FIGS. 3(*a*) and 3(*b*), but readily apparent in FIG. 2). The completed whole being encapsulated in an encapsulant material 109 for further processing.

Also, with reference to the plan view of one embodiment of a first leadframe 103, as shown FIG. 3(*c*), the first leadframe 103 comprises a first die attachment site 301 arranged to support the LS FET 102 and a second die attachment pad 302 arranged to support the controller 106. Additionally, a plurality of leads 303 are arranged about a periphery of the first leadframe 103. The first and second die attachment sites 301, 302 can comprise conductive contacts or large conductive pads useful for conducting heat away from the elements arranged thereon (e.g., the controller 106 or LS FET 102). But, most conveniently they can include conductive electrical contacts suitable for various electrical connections of the circuit elements. For example, referring to the first die attachment site 301, a gate electrical contact pad 311 and a source electrical contact pad 312 are formed. In this particular implementation the gate pad 311 is electrically connected with lead 303*g*. In this implementation, the source pad 312 can be conveniently electrically connected with outside elements using a bottom mounted source pad 312 which can also provide a large surface area suitable for sinking heat away from the completed package (and particularly the LS FET 102).

It is also pointed out that moats 304 can be formed on the leadframe 103 near edges of the die 102. These moats are arranged to restrict the spread of solder from its original location during reflow processes. These recesses or moats 304 can have edge features that operate to prevent the spread of solder from one electrical contact to another or to other nearby electrical elements. This wicking of solder prevents shorting or other undesirable electrical effects. Additionally, the moats are arranged to use the solder surface tension to maintain die alignment during fabrication.

Typically, a die (e.g., LS FET 102) is affixed to the first leadframe 103 using solder paste or other electrically conductive material. For example, BGA's can be used (e.g., using "Poly Balls" or other solder balls) which can be reflowed, as can the solder paste. In other embodiments, conductive epoxies or other materials can be used.

In the depicted implementation, a LS FET 102 includes a facing or front surface having a gate contact 102*g* and source contact 102*s* formed thereon. Commonly, an opposite or backside surface includes a drain contact 102*d*. The LS FET 102 can be mounted on the first leadframe 103 with the facing surface oriented toward the leadframe 103 to enable connection of the gate contact 102*g* with the gate pad 311 of the leadframe 103 and enabling the connection of the source contact 102*s* with the source pad 312. In one approach a reflow process can be used to secure the LS FET 102 with the first leadframe 103. FIG. 3(*d*) is a diagram showing the attachment of a LS FET 102 on one embodiment of a first leadframe 103.

On a wafer scale, an array of many such first leadframes 103 can have a plurality of LS FET's 102 attached to form an array of mounted FET's. It is pointed out that other suitable substrates may be used in place of the indicated leadframes.

Referring again to the section views of FIGS. 3(*a*)-3(*b*), a second die 101 is described, as is a mode of attachment. The second die comprises a HS FET 101 having a facing or front surface having a gate contact 101*g* and source contact 101*s* formed thereon. Commonly, an opposite or backside surface includes a drain contact 101*d*. The HS FET 101 can be mounted on the second leadframe 113 with the facing surface oriented toward the second leadframe 113 to enable connection of the gate contact 101*g* with the gate pad 321 of the second leadframe 113 and enabling the connection of the source contact 101*s* with the source pad 322. As before, a reflow process can be used to secure the HS FET 101 with the second leadframe 113.

Figure 4A:
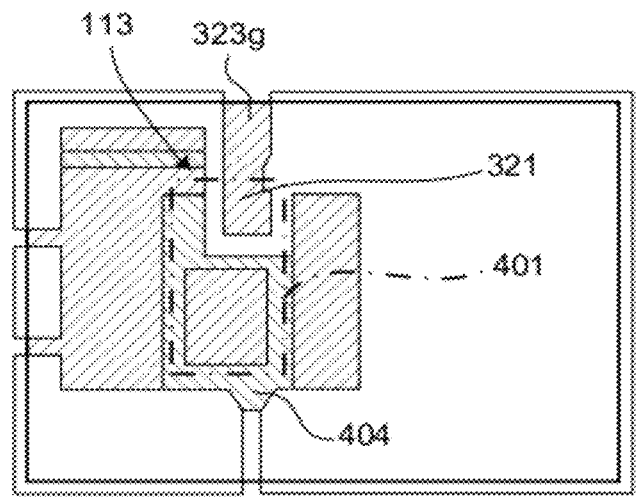
FIG. 4(a) is a plan view of a second leadframe embodiment constructed in accordance with the principles of embodiment of the present invention.
Figure 4B:
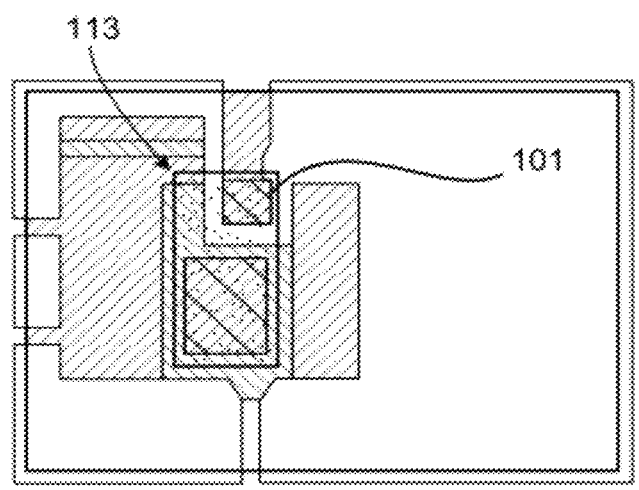
FIG. 4(b) is another plan view of the second leadframe embodiment depicted in FIG. 4(a) with a HS FET formed thereon.

One mode of attachment is described with respect to FIGS. 4(*a*)-4(*b*). FIG. 4(*a*) is a plan view of one embodiment of a second leadframe 113 and FIG. 4(*b*) is a diagram showing the attachment of a HS FET 101 on the embodiment of second leadframe 113 establishing electrical connection with the source contact 322 and the gate contact 321.

Referring again to the drawings, the second leadframe 114 has a die attach site 401 onto which the HS FET 101 is arranged. The HS FET 101 is attached on a top side of the die attachment site 401 of the second leadframe 113. This die attachment site includes contact pads for the HS FET 101, including a gate electrical contact pad 321 and a source electrical contact pad 322. In this particular implementation, the gate pad 321 forms part of a gate lead 323*g* which in assembly can optionally be electrically coupled with a number of different inputs. In particular switching signals can be applied to this lead. In on implementation, switching signals can be applied by controller circuitry. In one example, a controller chip can be wire bonded to the lead 323*g* to enable input of suitable signal. Of course other inputs from other sources can be applied.

It is also pointed out that, when assembled with the first leadframe 312, the source pad 322 can be conveniently electrically connected with the drain 102*d* of an underlying LS FET 102. The section view of FIG. 3(*b*) shows a connection of the HS FET source 101 through the second leadframe 113 to the drain 102*d* of the LS FET 102. Additionally a backside drain 101*d* is arranged facing away from the second leadframe 113.

As with the LS FET 102 described above, the HS FET 101 can also be mounted on a leadframe 113 configured with moats 404 that can be formed on the second leadframe 113 near (in this embodiment) the edges of the source contact 322 to prevent the substantial spread of solder from its original location during reflow processes. Again, these recesses or moats 304 can have edge features that operate to prevent the spread of solder from one electrical contact to another or to other nearby electrical elements. This wicking of solder prevents shorting or other undesirable electrical effects.

Also, as above, in a typical embodiment, a die (e.g., LS FET 101) is affixed to the second leadframe 113 using solder paste or other electrically conductive material. For example, BGA's can be used (e.g., using "Poly Balls" or other solder balls) which can be reflowed, as can the solder paste. In other embodiments, conductive epoxies or other materials can be used.

As described above, the depicted implementation shows a HS FET 101 with a gate contact 101g and source contact 101s formed on a facing or front surface of the FET 101. Commonly, an opposite or backside surface includes a drain contact 101d. The HS FET 101 can be mounted on the second leadframe 113 with the facing surface oriented toward the second leadframe 113 to enable connection of the gate contact 102g with the gate pad 321 of the second leadframe 113 and enabling the connection of the source contact 102s with the source pad 322. In one approach a reflow process can be used to secure the HS FET 101 with the second leadframe 113. On a wafer scale, an array of many such second leadframe 113 can have a plurality of HS FET's 101 attached to form an array of mounted HS FET's. It is pointed out that other suitable substrates may be used in place of the indicated leadframes.

Figure 3A:
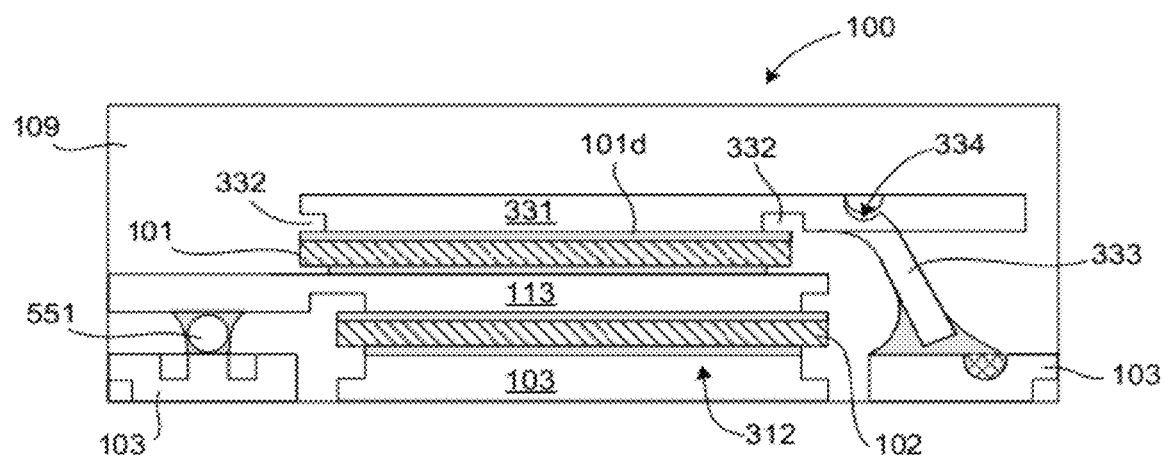
FIGS. 3(a) and 3(b) are simplified side section views of a portion of a power converter apparatus with stacked leadframes and FET devices in accordance with the principles of embodiment of the present invention.
Figure 3B:
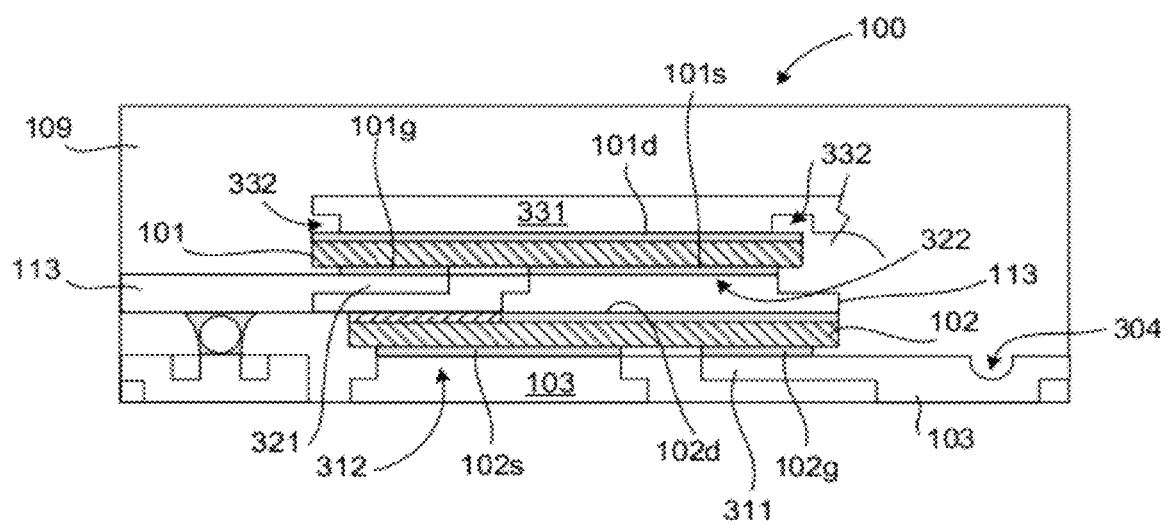
Figure 3C:
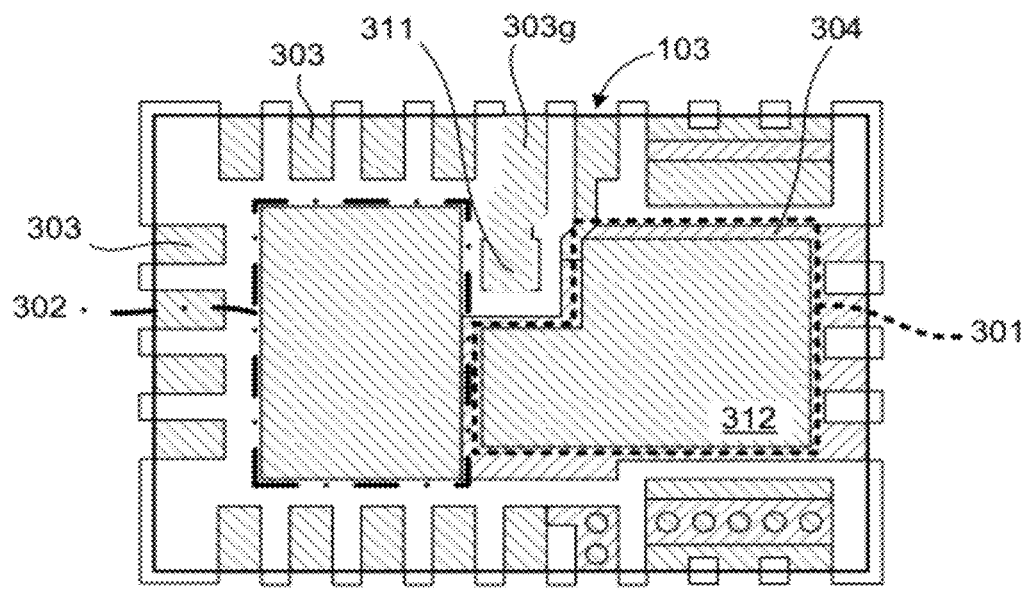
FIG. 3(c) is a plan view of a first leadframe embodiment constructed in accordance with the principles of embodiment of the present invention.
Figure 3D:
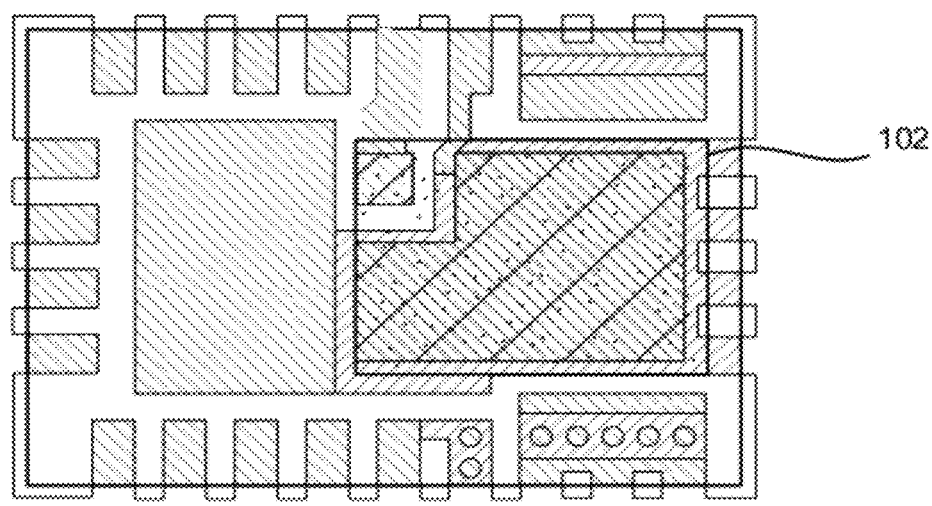
FIG. 3(d) is another plan view of the first leadframe embodiment depicted in FIG. 3(c) with a LS FET formed thereon.

It is further pointed out that in some embodiments a third leadframe 331 can be used. FIGS. 3(a) and 3(b) illustrate an implementation of a third leadframe 331. Functionally, a third leadframe 331 can be used to perform a number of functions. The third leadframe 331 can be used to provide an input voltage (Vin) for the package. In one example, the third leadframe 331 can be electrically coupled to a lead of the first leadframe 103 to enable supply of an external voltage. Many other electrical interconnection possibilities are also possible. Also, the third leadframe 331 can be used to provide a heat sink for the package enabling heat dissipation from the HS FET 101 as well as other systems.

Thus, in use the third leadframe 331 is electrically coupled with the drain 101d of the HS FET 101 to enable the supply of an input voltage to the package 100. Additionally, in one implementation the third leadframe 331 includes a reflow moat(s) 332 arranged around the HS FET 101 to prevent the spread of solder materials from the immediate vicinity of the HS FET 101. It is also pointed out that in some implementations a portion of the third leadframe 331 can include a tab 333 that extends downward. In one example, the tab 333 can be bent into position. One method of facilitating the bent configuration is to include a thinned portion 334 that more easily facilitates a mechanical bending process. In one such process, the bent tab 333 is bent downward to and orientation such that it supports the leadframe 331. In one implementation, the bent portion 333 is electrically connected with the first leadframe 103. In particular, the tab 333 can be electrically connected (e.g., using a solder material 335) with a lead of the first leadframe 103 to establish an outside connection.

Figure 5:
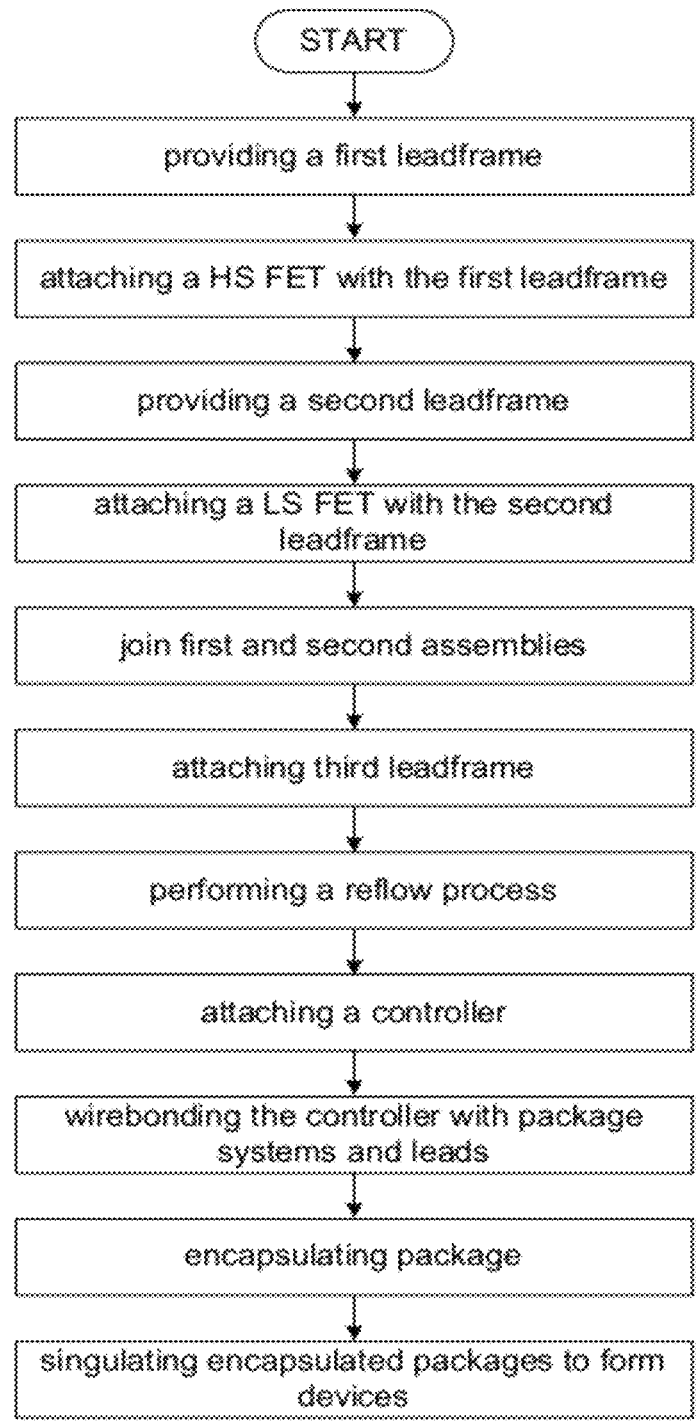
FIG. 5 is a flow diagram that illustrates a process embodiment that enabling construction of a stacked FET power converter including an interposer element in accordance with the principles of embodiment of the present invention.

FIG. 5 is a flow diagram that illustrates a series of fabrication operations used in an example process for fabricating power convertors such as discussed herein. Although disclosed as a process operable to form arrays of power converter packages, this disclosed process can be easily used to form single packages as well.

A process can begin by providing a first leadframe 103 preparing it for further fabrication (Step 501). Typically, such first leadframes can comprise an attachment site for a LS FET, a die attach pad for a controller and a plurality of leads. Commonly, such a first leadframe will be one of many such leadframes comprising a wafer scale array of such leadframes. Such an array can comprise wafer scale plurality of leadframes arranged for fabrication. Additionally, a pre-molded array of leadframes can be used. For example, a leadframe 103 can be treated with encapsulant (or other material) to lend structural rigidity, if desired. It should be pointed out that due to the consequences of being a stacked leadframe structure certain singulation difficulties can be encountered (see, the discussion of singulation below). Accordingly, a wider space between each leadframe can be employed. Typically the distance between adjacent leadframes is dictated by the size, thicknesses, and types of leadframes, as well as those of the cutting blades as well as other factors. Thus, a sufficient distance lies between the leadframes enabling specialized cutting blades to be used during singulation. One such suitable first leadframe 103 is shown, by way of example, in the simplified illustration of FIGS. 3(c)-3(d). Such a first leadframe 103 can be configured in a number of different formats. In the depicted embodiment a controller DAP 302, a LS FET attachment site 301, and a number of leads 303 can be arranged to provide a suitable embodiment. Additionally, leadframe 103 can then be treated with a solder paste to enable suitable for a LS FET 102. For example, all of the gate pads 311 and source pads 312 of the array of first leadframes 103 are treated with solder paste (or solder balls or conductive epoxy, etc.). Formation of such solder pads can be achieved using a variety of methods known in the art.

To continue, a LS FET 102 is attached to the first leadframe 103 to form a first leadframe assembly (Step 503). In an array scale process, a plurality of LS FET's 102 are positioned, aligning, and attached to the attachment sites using the pads 311, 312. This attachment is typically facilitated with a reflow process. Additionally, alternate embodiments employ a BGA attachment process rather than the solder paste method. Such a reflow process is generally followed cleaning process for removing solder process residues.

Further, a second leadframe 113 is prepared for further fabrication (Step 505). Typically, such first leadframes can comprise an attachment site for a HS FET, and can, in some cases, include a plurality of leads or other electrical connections. Importantly, the second leadframe has a gate pad and a source bad and also a backside contact for an underlying LS FET drain.

As before, such a second leadframe can comprise one of the leadframes comprising an array of such leadframes. Additionally, an array of pre-molded leadframes can be used. The simplified illustration of FIGS. 3(a)-3(d) illustrates one type of second leadframe embodiment 113. Such a leadframe 113 can be configured in a number of different formats. In the depicted embodiment a LS FET attachment site 401, and a number of leads can be arranged to provide a suitable embodiment. Additionally, leadframe 113 can then be treated with a solder paste to enable suitable for a HS FET 101. For example, all of the gate pads 321 and source pads 322 of the array of second leadframes 113 are treated with solder paste (or solder balls or conductive epoxy, etc.). Formation of such solder pads can be achieved using a variety of methods known in the art.

To continue, a HS FET 101 is attached to the second leadframe 113 to form a second leadframe assembly (Step 507). In an array scale process, a plurality of HS FET's 101 are positioned, aligning, and attached to the attachment sites of the appropriate second leadframes 113. This attachment is can also be achieved using a reflow process. Alternate embodiments can employ a BGA attachment process rather than the solder paste method. As above, reflow processes are generally followed cleaning processes suitable for removing solder process residues.

The first and second leadframe assemblies (including the FET's) are positioned, aligned, and then joined to make a leadframe stack (Step 509). In an array implementation, an array of first assemblies and an array of second assemblies can be appropriately aligned and then joined to form an array of stacked assemblies. In one embodiment, the leadframe stack could be joined by arranging a solder paste (or other appropriate conductive material) at one of the drain 102d of the first leadframe assembly 102/103 assembly or arranging the paste (or other suitable material) at the drain contact portion of the first leadframe 101 and then join the two assemblies together. The assemblies can be reflowed at this point (or later in the process). It should be pointed out that solder balls 551 or other conductive structures can be used in addition to, or instead of, the solder paste. For example, in the example depicted in FIGS. 3(*a*) and 3(*b*), solder balls 551 electrically interconnect a second leadframe 113 with the first leadframe 103. In some embodiments connecting the gate contact 321 with a lead or other portion of the first leadframe 103. Additionally, the solder balls 551 can be useful for supporting the second leadframe 113 in a spaced apart arrangement form the first leadframe 103. So-called poly-balls can be used. Such balls can include, ceramic, polyimide, and other semi-rigid solder structures. In general, any size controlled solder ball application can be used.

It should be pointed out that other process approaches can be used. For example, the second leadframe 113 can have the LS FET 102 attached to one side and the HS FET 101 attached to the other. The first leadframe and third leadframe can be bonded to the FETs and then the whole can be reflow processed and cleaned and subject to further processing. Although, not the preferred implementation, this disclosure contemplates other different approaches which are also within the scope of this invention.

Additionally, where applicable, a third leadframe 331 can be attached with structure (Step 511). In some embodiment, the leadframe 331 can be treated with a solder paste or other suitable conductive material. Alternatively, or additionally, the solder paste or other conductive material can be applied to the drain 101*d* of the HS FET 101. As before, the frame 331 can be joined with the stacked assemblies and the whole subject to further processing.

In addition to the selected reflow steps, the stacked leadframes can be reflowed together in a single step (Step 513). Again, these reflow processes are generally followed by a cleaning process that can remove solder process residues. This implementation benefits from requiring but a single reflow and a single cleaning step and therefore presents some advantages.

To continue, the controller circuitry 114 is attached with the package 100 (Step 515). Typically, a controller device 114 (e.g., a controller IC) is attached using an epoxy, but can be attached using a wide range of approaches, including, but not limited to bonding with a thermally conductive material to a thermally conductive die attach pad of the first leadframe 103. Alternatively, conductive attachment can be made with the underlying die attach pad 302.

The controller 114 is then wire bonded with the various elements and leadframe leads (Step 517). In many embodiment, it desirable to perform all reflow processes and cleaning operations prior to the attachment of the controller. Such an order of operations will prevent the deposition of various residues formed by reflow processes. Such can be accomplished using a wide range of techniques and processes know in the art. The completed device package is then encapsulated using an appropriate encapsulant (Step 519). Once the encapsulant is cured, an array of formed and encapsulated converter packages can be singulated into separate device packages (Step 521). In one embodiment, care must be taken in singulating packages from an array of such packages. The close arrangement of the leadframes complicates ordinary singulation processes. Ordinary singulation blades are thin and can be somewhat flexible which can result in a smearing of metal from the edge of one level to the edge of another level. This may lead to shorting and device malfunction as well as other problems. Accordingly, the inventors have discovered to another approach to singulating the packages. A stiffer and generally wider blade is typically needed. Suitable blades are generally at least 14 mil wide enabling the requisite blade stiffness. The cutting surfaces can comprise diamond, metal, as well as other blade materials or composites suitable for cutting encapsulated packages of a type described herein. Standard 2 mil thick blades are generally insufficiently rigid. Thus, an array of packages can be singulated to form a numbers of individual packages.

A singulation punch tool and process is now briefly discussed. FIGS. 6(*a*)-6(*f*) can be used to illustrate one embodiment of an approach in accordance with the principles of the present invention.

FIG. 6(*a*) is a perspective view showing an upper surface of one embodiment of a mounting tool 600. In this view, a leadframe mounting site 601 is shown. In most general terms, the site 601 is a surface upon which a leadframe can be positioned during. In this embodiment, the site includes a clearance recess 602 arranged such that when a leadframe is mounted with the tool 600 a down ward facing die can fit into the recess 602 without contact. This will prevent the die from being damaged during processing.

Additionally, the tool 600 includes at least one complementary alignment feature 603 arranged to engage with a mated alignment feature of a leadframe that will be mounted with the tool 600. The alignment feature 603 can be a single feature but is most commonly a plurality of such features arranged such that when engaged with the features of the leadframe it will be properly oriented. In this implementation, the alignment features 603 are configured such that several leadframes can be stacked one on top of the other to enable correct alignment among all of the leadframes. Such enables alignment between the leadframes as well as any circuit elements formed thereon. This enables circuit alignment such that solder ball connections can be made.

In this implementation, the alignment features 603 comprise a plurality of alignment members that extend upward from the leadframe mounting site 601 to enable leadframes having alignment features to be fitted into place and thereby attain the desired alignment between a stacked structure of such leadframes. It is pointed out that here, the features 603 can comprise a number of pegs arranged such that leadframes can be mounted on the tool 600 by fitting alignment holes of the leadframes onto the pegs to achieve desired positioning and alignment. Such leadframes can comprise the many leadframes described elsewhere in this discussion. It is specifically pointed out that many shapes sizes and configurations of such alignment features can be used in accordance with the many possible embodiments of the present invention.

An additional feature is a set of punch apertures 604. In this implementation, the punch apertures 604 comprise openings formed in the surface of the tool sized to accommodate a punching tool. Such apertures can comprise recesses in the surface or holes that pass entirely through the mounting tool. The disclosure contemplates that such apertures can come in a wide variety of shapes and sizes.

Importantly, the apertures are used to separate portions of a leadframe. Leadframes support the individual die attachment sites and leads of the frame using a plurality of tie bars. Most typically the tie bars are located at each corner of the leadframe. During manufacture, the tie bars are cut away enabling the dice to be singulated into separate devices. In this implementation, when a leadframe is mounted and aligned on the mounting tool 600 (e.g., using features 603) the tie bars are positioned over the punch apertures 604. Once position, a punch tool can be pushed into the aperture 604 to sever the tie bar. FIGS. 6(b)-6(e) can be used to illustrate one example process using a mounting tool.

To begin, a number of example leadframes are shown. It is expressly pointed out that such leadframes are examples only and the leadframes and their order of processing can be substantially varied in accord with the need of the used.

Figure 6A:
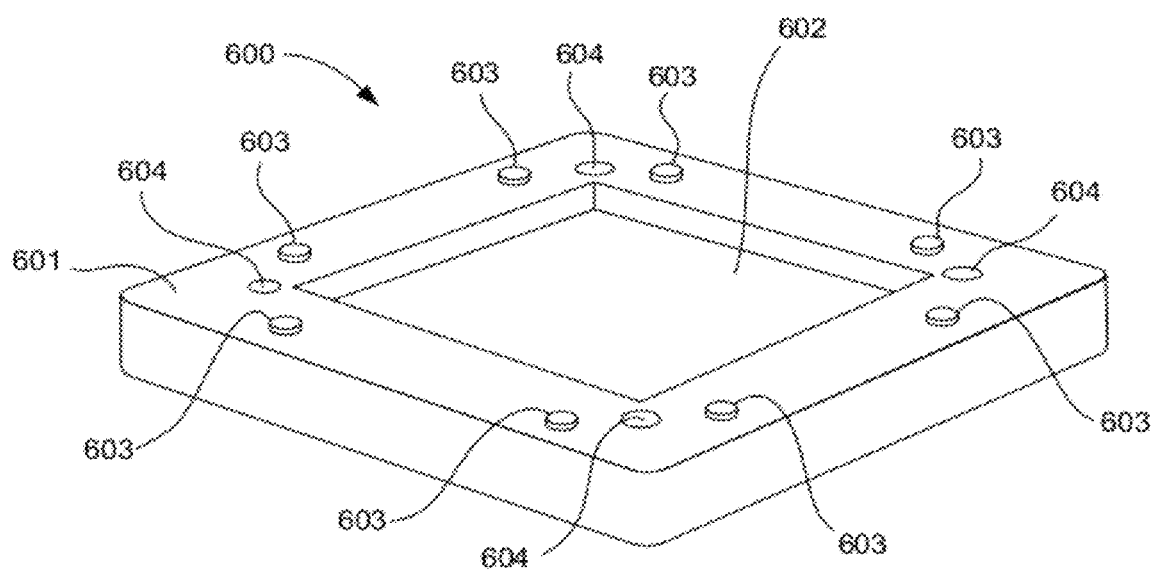
FIG. 6(a) is a perspective view of a mounting tool embodiment depicted in FIG. 4(a) with a HS FET formed thereon.
Figure 6B:
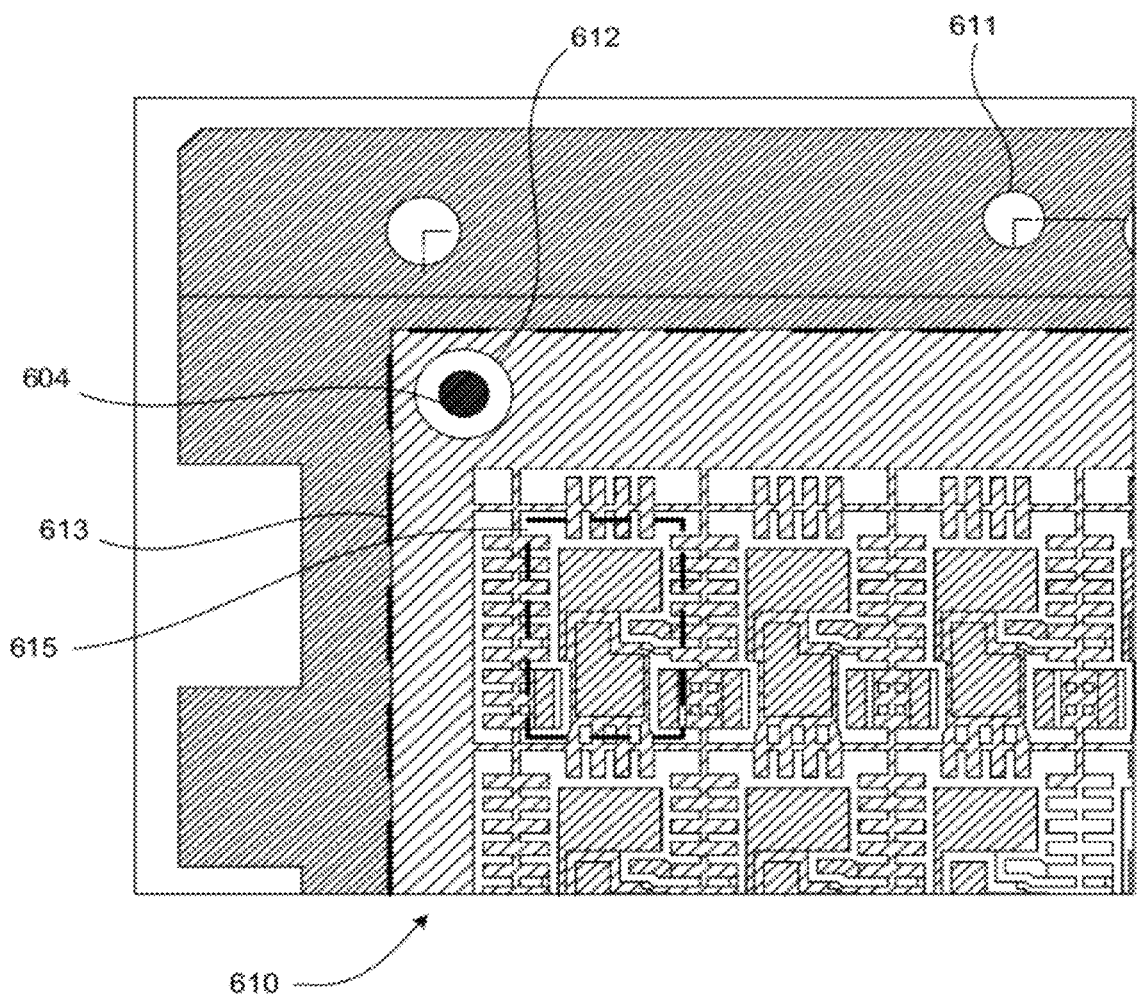
FIGS. 6(b)-6(d) are plan views of portions of the various leadframes in a leadframe stack that can be used in a package embodiment disclosed in accordance with the principles of the present invention.

FIG. 6(b) is a plan view showing a portion of an upper leadframe 610. Here, upper is meant to apply to the first leadframe mounted on the mounting tool 600. In this view, the upper leadframe 610 is shown having a set of alignment features 611 configured to engage with the complementary alignment features 603 of the mounting tool 600. Once engaged, the two sets of alignment features (603, 611) position the leadframe 610 in the desired alignment with the tool 600. With further reference to FIG. 6(b) a punch access opening 612 is arranged in the leadframe 610 to enable access to the punch aperture 604 of the mounting tool 600 (shown in abstract by the dark region 604). By way of reference the outer boundary of an encapsulant mold envelope 613 is shown. Such a leadframe 610 typically includes an array of attached device areas 615 (collectively including bond pads, leads, interconnects, and so on) arranged next to one another on the leadframe 610.

Figure 6C:
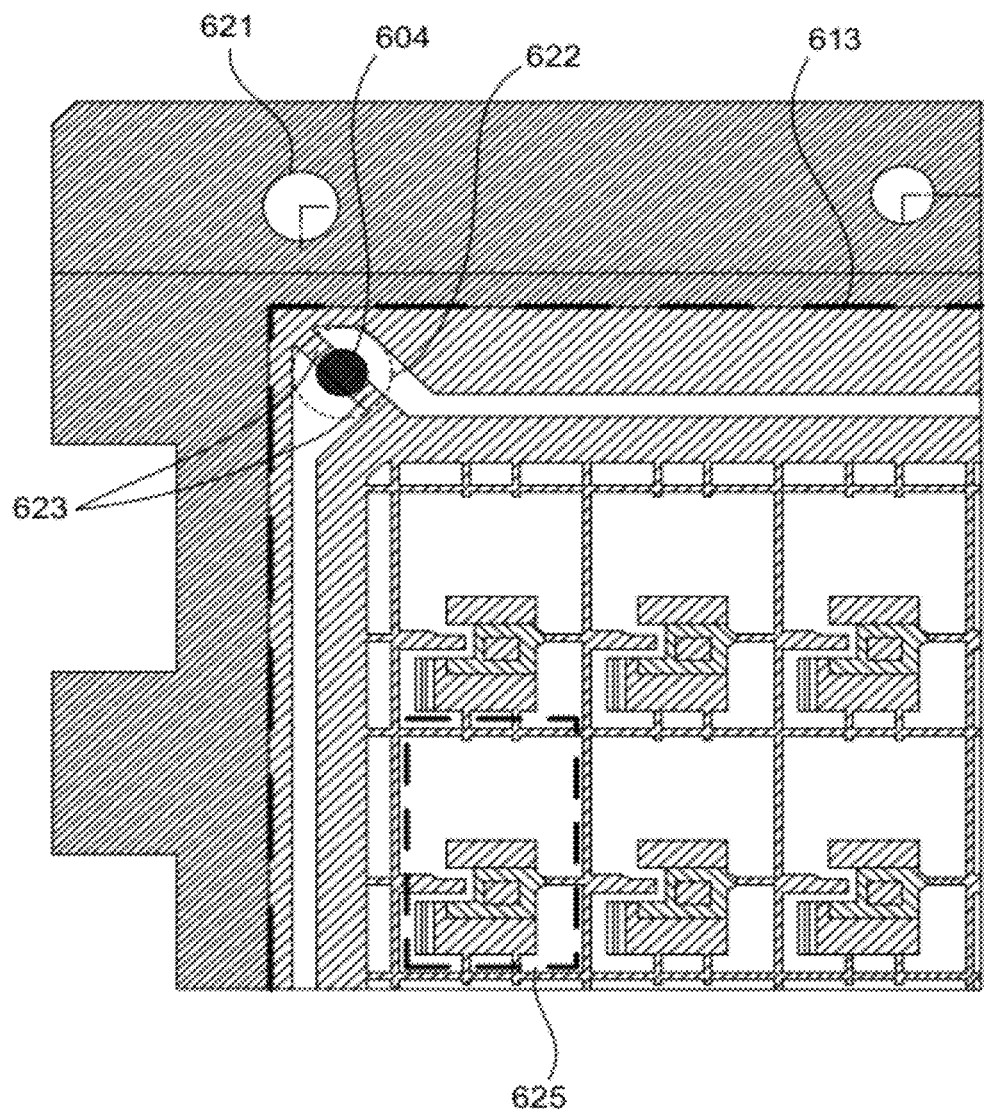

To continue, FIG. 6(c) is a plan view showing a portion of a next or second leadframe 620 in the stack. This second leadframe 620 will be mounted on the mounting tool 600 over the first leadframe 610. In this view, the second leadframe 620 is shown having a set of alignment features 621 arranged at an outer portion of the leadframe 620 and configured to engage with the complementary alignment features 603 of the mounting tool 600. Once engaged, the two sets of alignment features (603, 621) position the leadframe 620 in the desired alignment with the tool 600 and with the previously mounted leadframe 610. With further reference to FIG. 6(c) a punch access opening 622 is arranged in the leadframe 620 to enable access to the punch aperture 604 of the mounting tool 600 (shown in abstract by the dark region 604). Importantly, a tie bar 623 of the leadframe 620 is shown. The configuration of the tie bar 622 and the punch aperture 604 are arranged such that when the leadframe 620 is positioned and aligned using the alignment features 621 of the leadframe and the complementary features 603 of the leadframe 600, then the tie bar 623 lies above the punch aperture 604. Additionally, such leadframes 620 typically include an array of attached device areas 625 (collectively including bond pads, leads, interconnects, and so on) arranged next to one another on the leadframe 620 typically include a plurality of bond pads and associated leads (collectively 625) arranged in an array of die mounting sites.

Figure 6D:
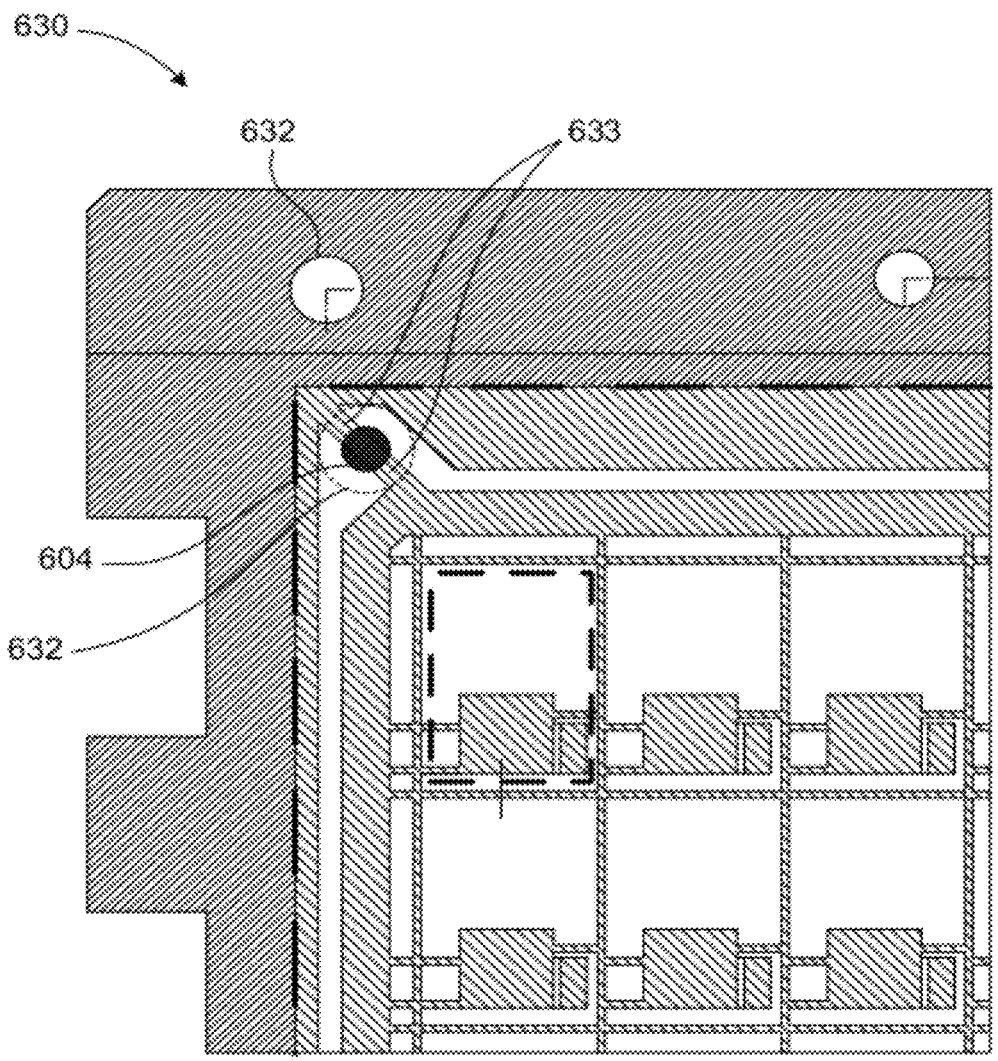

In embodiments that use more than two stacked leadframes, reference is made to FIG. 6(d) which is a plan view showing a portion of another or third leadframe 630 in the stack. This third leadframe 630 will be mounted on the mounting tool 600 over the second leadframe 620. Again, the third leadframe 630 is shown having a set of alignment features 631 arranged at an outer portion of the leadframe 630 and configured to engage with the complementary alignment features 603 of the mounting tool 600. Once engaged, the two sets of alignment features (603, 631) position the leadframe 630 in the desired alignment with the tool 600 and with the previously mounted leadframes 610, 620 (and any dice mounted therewith). Additionally, a punch access opening 632 is shown as being arranged in the leadframe 630 to enable access to the punch aperture 604 of the mounting tool 600 (as before, shown in the abstract by the dark region 604). Importantly, a tie bar 633 of the leadframe 630 is shown. As with the second leadframe 620, the tie bar 622 is arranged in registry with the punch aperture 604 when the third leadframe 630 is positioned with the alignment features 631 and the complementary features 603 of the leadframe 600. As above, such leadframes 630 typically include an array of attached device areas 635 (collectively including bond pads, leads, interconnects, and so on) arranged next to one another on the leadframe 630.

Figure 6E:
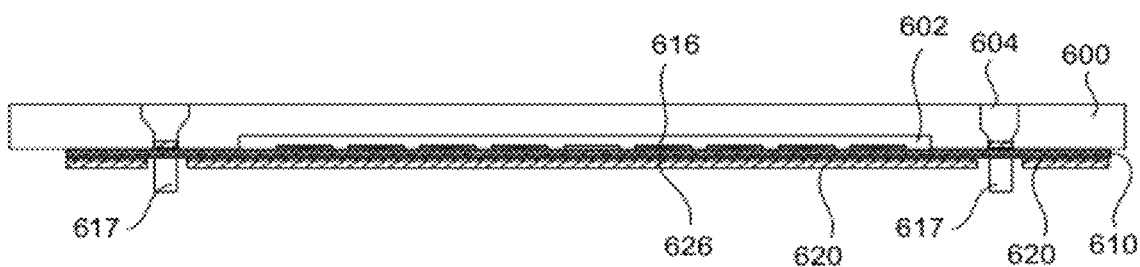
FIGS. 6(e)-6(f) are section views of a mounting tool and associated leadframes describing various process flows that can be used to form stacked leadframe packages in accordance with the principles of the present invention.
Figure 6F:
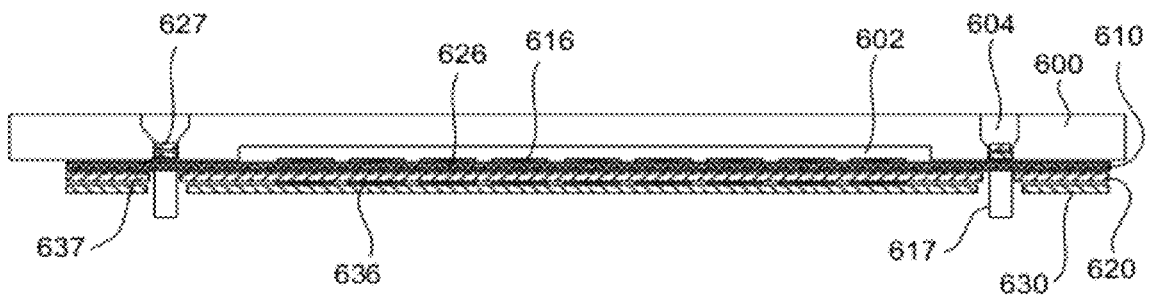

FIGS. 6(e) and 6(f) can be used to illustrate aspects of mounting tool operation. FIGS. 6(e) and 6(f) are cross-section views of a mounting tool and associated leadframes.

The mounting tool 600 is shown here having a first leadframe 610 mounted thereon. In one example, the first leadframe 610 can comprise first leadframe 103, although many such other possibilities are contemplated. In this depiction, the first leadframe 610 is arranged with IC's 616 (and/or other circuit elements) in place on the leadframe 610. Such can be mounted using solder paste, but any of a wide range of other interconnection modes can be used. In this depiction, the first leadframe 610 is arranged with the die and other circuitry 616 arranged facing the tool 600 and extending into the recess 602. This arrangement could be reversed such that the die 616 are arranged facing away from the tool 600. It is also pointed out that in such an arrangement, the tool need not have the recess 602. Although not shown in this view, the alignment features 611 of the first leadframe 610 are engaged with the complementary alignment features 603 of the tool 600 to properly align the tool with the leadframe.

A second leadframe 620 is then mounted with the first leadframe 610 using the tool 600. In this depiction, the second leadframe 620 is also arranged with a second group of IC's 626 (and/or other circuit elements) placed on the leadframe 620. Again, such mounting can use solder paste or other interconnection modes. Although not shown in this view, the alignment features 621 of the second leadframe 620 are engaged with the complementary alignment features 603 of the tool 600 to properly align the second leadframe 620 with the tool 600 and with the first leadframe 610. Solder paste can also be used to couple the die 626 with the first leadframe 610. It should also be pointed out that when the die 616 face away from the tool 600, solder paste can also be used to couple the die 616 with the second leadframe 620.

At this point the leadframe stack 610, 620 (and associated die) is subjected to a reflow process to more permanently couple the elements of the lead stack using the solder paste.

Subsequently, a punching tool 617 is aligned with each of the punch apertures 604 and pushed into the apertures 604 severing the tie bars 623 of the second leadframe 620. The leadframe stack 610, 620 is then encapsulated. Where, as is typical, the leadframes comprise an array of IC devices, the devices are then singulated to form the completed packages.

Referring now to the cross-section illustration of FIG. 6(f), the mounting tool 600 is shown in another stacked leadframe implementation. Here a three leadframe stack is implemented. The tool 600 has a first leadframe 610 mounted thereon. Again, the first leadframe 610 can comprise the leadframe 103 as described above, although many other possibilities are contemplated. Again, the first leadframe 610 is arranged with IC's 616 (and/or other circuit elements) in place on the leadframe 610. Such can be mounted using solder paste, but a wide range of other materials can be used. In this depiction, the first leadframe 610 is arranged with IC dice 616 (and other circuitry) are arranged facing the recess 602 of the tool 600. As before, the arrangement could be reversed with the die 616 facing away from the tool 600. As pointed out before, where the leadframes 610 do not have dice or circuitry facing into the tool 600, the tool need not have the recess 602. The inventors point out that in some less preferred implementations the circuitry and dice can face into a tool without recess. The alignment features 611 of the first leadframe 610 are engaged with the complementary alignment features 603 of the tool 600 to properly align the tool with the leadframe.

A second leadframe 620 is then mounted on the first leadframe 610 using the tool 600. In this depiction, the second leadframe 620 includes a second group of IC's 626 (and/or other circuit elements) formed thereon. Again, such mounting can use solder paste or other methods. The alignment features 621 of the second leadframe 620 are engaged with the complementary alignment features 603 of the tool 600 to properly align the second leadframe 620. Solder paste can also be used to couple the die 626 with the first leadframe 610. It should also be pointed out that when the die 616 face away from the tool 600, solder paste can also be used to couple the die 616 with the second leadframe 620.

In one process, at this point the leadframe stack 610, 620 (and associated die) can subjected to a reflow process to more permanently couple the elements of the lead stack using the reflowed solder paste. Additionally, in this process, the punching tool 617 is aligned with each of the punch apertures 604 and pushed into the apertures 604 severing the tie bars 623 of the second leadframe 620. In this depiction, the punched out portions 627 of the tie bar are shown.

Continuing the process, a third leadframe 630 is then mounted on the second leadframe 620 using the tool 600. In this depiction, the third leadframe 630 is mounted much the same as the second leadframe 620. In this depiction, the third leadframe 630 includes a second group of IC's 636 (and/or other circuit elements) formed thereon. Again, such mounting can use solder paste or other methods. It is pointed out that such circuitry 636 is not crucial in all embodiments. The alignment features 631 of the third leadframe 630 are engaged with the complementary alignment features 603 of the tool 600 thereby properly aligning the third leadframe 630 with the second leadframe 620 and the first leadframe 610. Solder paste can also be used to couple the die 636 with the second leadframe 620 if desired.

The leadframe stack 610, 620, 630 is then reflowed again to more permanently couple the elements (e.g., 620, 630, and also, if desired, 636) of the lead stack using the reflowed solder paste.

Additionally, in this process, the punching tool 617 is aligned again with each of the punch apertures 604 and pushed into the apertures 604 severing the tie bars 633 of the third leadframe 630. In this depiction, the punched out portions 637 of the tie bar are shown.

Then the entire stack is encapsulated. Where the stack comprises an array of IC devices, the devices are then singulated to form the completed packages.

In another related process, the leadframe stack 610, 620 (and associated die) are mounted and reflowed as before as before. Instead of removing the tie bars at this point, the third leadframe 630 is mounted and reflowed to join it with the leadframe stack. Once the stack has been mounted and reflowed to fix the leadframes 610, 620, 630 in place, then the punch tool can be used.

Here, in this approach, the punching tool 617 is aligned with each of the punch apertures 604 and pushed into the apertures 604 severing the tie bars 623, 633 of the second and third leadframes 620, 630. This has the advantage of being quicker, but may impose stresses on the leadframes causing the solder joints to fail in some small fraction of cases. In this depiction, the punched out portions 627, 637 of the tie bars are shown.

Continuing the process, the entire stack is encapsulated and then singulated to form the completed packages.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of forming a power converter package, the method comprising,
    arranging a LS FET on a first die attach site of a first leadframe enabling electrical connection between a LS FET gate and a gate pad of the first leadframe and between a LS FET source and a source pad of the first leadframe a first arrangement;
    arranging a HS FET on a second die attach site of a second leadframe enabling electrical connection between a HS FET gate and a gate pad of the second leadframe and between a HS FET source and a source pad of the second leadframe forming a flipchip arrangement;
    arranging the flipchip arrangement on the first arrangement such that the HS FET source is electrically connected with a drain of the LS FET through the second leadframe;
    reflow processing the power converter package so that solder connections between the HS and LS FET's and the associated first and second leadframes are formed by said reflow processing;
    mounting a controller to the power converter package;
    establishing electrical connections between the controller and the HS FET and the LS FET by wirebonding; and
    encapsulating the power converter package.

2. The method of claim 1 wherein attaching a controller to the power converter package comprises attaching the controller to the first leadframe.

3. The method of claim 1 further comprising,
    arranging a third leadframe above the first and second leadframes to provide electrical connection with a drain of the HS FET wherein said connection is configured to enable input voltage to be supplied to the power converter package; and
    wherein said reflow processing is used to mount the third leadframe with the package.

4. The method of claim 3 wherein the reflow processing used to connect the LS and HS FET's and the leadframes is performed prior to mounting the controller.

5. The method of claim 1 wherein reflow processing the power converter package so that at least some of the solder connections between the HS and LS FET's and the associated first and second leadframes are formed by reflow processing of a solder paste used to affix the HS and LS FET's with the associated first and second leadframes.

6. A method of forming a power converter package, the method comprising, providing an array of first leadframes and an array of second leadframes and a plurality of LS FET's and a plurality of HS FET's;

coupling the plurality of LS FET's with a plurality of first die attach sites, each first die attach site associated with a respective one of said plurality of first leadframes thereby enabling electrical connection between a LS FET gate of each LS FET and a gate pad of the respective first leadframe and enabling electrical connection between a LS FET source of each LS FET and the respective source pad of the first leadframe, thereby generating a first array;

coupling the plurality of LS FET's with a plurality of second die attach sites, each second die attach site associated with a respective one of said plurality of second leadframes thereby enabling electrical connection between a HS FET gate of each HS FET and a gate pad of the respective second leadframe and enabling electrical connection between a HS FET source of each HS FET and the respective source pad of the first leadframe forming a second array;

arranging the second array on the first array such that the plurality of HS FET sources are electrically connected with drains of the LS FET's through the plurality of second leadframes to form an array of stacked leadframes;

mounting a plurality of controllers on at least one of,
the array of first leadframes,
the array of second leadframes,
the array of stacked leadframes;

wirebonding the plurality of controllers to establish electrical connections with appropriate LS and HS FET's;

encapsulating the stacked leadframes; and singulating the encapsulated stacked leadframes to form a plurality of power converter packages.

7. The method of claim 6 further comprising, arranging a third array comprising a plurality of third leadframes above the first and second arrays to provide electrical connections between the plurality of third leadframes and complementary drains of the plurality of HS FET's wherein said electrical connections are configured to enable input voltage to be supplied to said power converter package; and wherein,
said coupling of the LS FET's with the first leadframes and the second leadframes,
said coupling of the HS FET's with the second leadframes; and
said coupling of the HS FET's with the third leadframes,
comprises performing a reflow process to mount and electrically connect the leadframes and the LS and HS FET's.

8. The method of claim 6 wherein said reflow process is performed prior to the mounting of the plurality of controllers.

9. A method of forming a multiple stacked leadframe integrated circuit (IC) package, the method comprising, mounting a first IC die on a die attachment site of a first leadframe to form a first arrangement;

mounting a second IC die on a die attachment site of a second leadframe to form a second arrangement;

mounting the first arrangement with the second arrangement such that they are arranged one over another in a stacked leadframe configuration; and encapsulating the stacked leadframe configuration to form the IC package having the first and second IC dies, wherein, a die mounting tool is provided, the tool comprising complementary alignment features suitable for aligning leadframes arranged on the tool and punch apertures suitable for enabling removal of portions of leadframes stacked on the tool; and wherein mounting the leadframes of the stacked leadframe further comprises, mounting the first arrangement on the tool using first alignment features of the first leadframe, such that the first alignment features are in registry with at least some of the complementary alignment features of the tool, mounting the second arrangement over the first arrangement using second alignment features of the second leadframe and at least some of the complementary alignment features of the tool to attain desired alignment between the first and second leadframes and align with the tool such that tie bars of the second leadframe are in registry with the punch apertures of the tool, and reflow processing to secure the first and second arrangements with each other; and further comprising, punching through the punch apertures of the tool to sever the tie bars of the second leadframe.

10. The method of claim 9 further comprising, arranging a third leadframe above the first and second leadframes; and wherein said reflow processing is used to mount the third leadframe with the package.

11. The method of claim 10 wherein mounting the leadframes of the stacked leadframe further comprises, mounting the third leadframe over the stacked first and second arrangements using third alignment features of the third leadframe and at least some of the complementary alignment features of the tool to attain desired alignment between the third leadframe and the stacked first and second arrangements and align with the tool such that tie bars of the third leadframe are in registry with the punch apertures of the tool, and reflow processing to secure the first arrangement, second arrangement, and the third leadframe with each other; and further comprising, punching through the punch apertures of the tool to sever the tie bars of the third leadframe.

* * * * *